(12) United States Patent
Kitahara et al.

(10) Patent No.: US 9,300,287 B2
(45) Date of Patent: Mar. 29, 2016

(54) SOLID STATE RELAY AND LOAD DRIVE CIRCUIT

(71) Applicant: OMRON CORPORATION, Kyoto-shi, Kyoto (JP)

(72) Inventors: Yasuyuki Kitahara, Saga (JP); Takeshi Shimbaba, Takeo (JP)

(73) Assignee: Omron Corporation, Kyoto-shi (JP)

( * ) Notice: Subject to any disclaimer, the term of this patent is extended or adjusted under 35 U.S.C. 154(b) by 308 days.

(21) Appl. No.: 13/657,384

(22) Filed: Oct. 22, 2012

(65) Prior Publication Data
US 2013/0113382 A1 May 9, 2013

(30) Foreign Application Priority Data

Nov. 4, 2011 (JP) .................................. 2011-242444

(51) Int. Cl.
| | |
|---|---|
| H05B 39/00 | (2006.01) |
| H03K 17/79 | (2006.01) |
| H03K 17/0814 | (2006.01) |
| H03K 17/725 | (2006.01) |

(52) U.S. Cl.
CPC .......... *H03K 17/79* (2013.01); *H03K 17/08144* (2013.01); *H03K 17/725* (2013.01); *H03K 2217/0009* (2013.01)

(58) Field of Classification Search
USPC .......... 315/151; 327/459, 514, 402, 455, 456, 327/476; 361/2, 104
See application file for complete search history.

(56) References Cited

U.S. PATENT DOCUMENTS 4,158,150 A    6/1979    Dever

FOREIGN PATENT DOCUMENTS

| EP | 0 245 769 A1 | 11/1987 |
|---|---|---|
| JP | H07-115307 A | 1/1995 |
| JP | H07015307 A * | 1/1995 |
| JP | H11-27125 A | 1/1999 |
| JP | 3469045 B2 * | 11/2003 |
| JP | 2009-060322 | 3/2009 |

OTHER PUBLICATIONS

European Search Report dated Nov. 11, 2013 issued in connection with European Application No. 12189503.1.

* cited by examiner

*Primary Examiner* — Douglas W Owens
*Assistant Examiner* — Monica C King
(74) *Attorney, Agent, or Firm* — Foley & Lardner LLP

(57) ABSTRACT

A solid state relay includes a light-receiving element, output terminals configured to connect to an AC power supply and a load, a first connection line connecting a first end of the light-receiving element to a first output terminal, a second connection line that connects a second end of the light-receiving element to a second output terminal, a switching element between the first connection line and the second connection and configured to be turned on by the current outputted from the light-receiving element, and a snubber circuit in which a capacitor and a resistor are connected in series. The resistor of the snubber circuit connects to the first connection line between one of the first and second end of the light-receiving element and an end of the switching element, and an overcurrent protection element connects to the first connection line between the resistor and an end of the switching element.

6 Claims, 3 Drawing Sheets

SOLID STATE RELAY AND LOAD DRIVE CIRCUIT

TECHNICAL FIELD

The present embodiments relate to a solid state relay and a load drive circuit including the solid state relay.

BACKGROUND ART

Conventionally, there is a known solid state relay including a third connection line that connects a node of a capacitor and a resistor which constitute a snubber circuit, to a gate terminal of a triac (for example, refer to Japanese Patent Application Laid-Open Publication No. 2009-60322). However, the conventional solid state relay has a problem in that, due to a shock or the like, a crack is likely to occur in the capacitor, resulting in the snubber circuit being burnt; or the triac is likely to be disconnected, resulting in the control circuit including the triac being burnt.

SUMMARY

The present embodiments have been devised to solve the problems described above, and an object of the embodiments is to provide a solid state relay and a load drive circuit including the solid state relay, where the solid state relay not only has a simple and inexpensive configuration but also has a function of being capable of appropriately preventing electronic parts from being burnt even if either a snubber circuit or a control circuit is damaged.

In accordance with one aspect of the embodiments, a solid state relay includes a pair of input terminals; a light-emitting element between the pair of input terminals; a light-receiving element configured to carry out photoelectric conversion on light outputted from the light-emitting element and configured to output electric current; a pair of output terminals configured to connect to an AC power supply and a load, the pair of output terminals including a first output terminal and a second output terminal; a first connection line connecting a first end of the light-receiving element to the first output terminal; a second connection line connecting a second end of the light-receiving element to the second output terminal; a switching element between the first connection line and the second connection line and configured to be turned on by the current outputted from the light-receiving element; and a snubber circuit between the first connection line and the second connection line and including a capacitor and a resistor, the capacitor and the resistor connected in series, the resistor is in the first connection line between the first end of the light-receiving element and an end of the switching element, an over-current protection element is in the first connection line between one of the first end and the second end of the resistor and an end of the switching element.

With this configuration, when the capacitor of the snubber circuit short-circuits, since the output terminals are connected to each other via the snubber circuit and the over-current protection element, even if an over-current flows between the output terminals, burning of other parts is prevented because of the over-current protection element. Moreover, when the switching element is disconnected, since the output terminals are connected to each other via the light-receiving element, even if an over-current flows between the output terminals, burning of other parts is also prevented because of the over-current protection element. In this way, even if a problem occurs in either one of the snubber circuit and the switching element, it is possible to prevent the other parts from being burnt by making use of the single over-current protection element. Therefore, it is possible to cope with any failure in the snubber circuit and the switching element with a simple and inexpensive configuration.

It is preferable that the resistor of the snubber circuit be provided in the first connection line.

With this configuration, it is possible to prevent an over-current from flowing to the light-receiving element side when the switching element is disconnected by using the resistor of the snubber circuit.

The light-receiving element may be a phototriac coupler, and the switching element and the capacitor may connect to the phototriac coupler in parallel.

The light-receiving element may be a photo-transistor coupler, a bridge type full wave rectifying circuit and a thyristor for turning on/off the bridge type full wave rectifying circuit may be connected to the photo-transistor coupler via an output circuit, the switching element and the capacitor may be connected in parallel, and an output terminal of the bridge type full wave rectifying circuit may connect to the switching element.

In accordance with another aspect of the embodiments, a load drive circuit includes any of the solid state relays described above, and a load and a power supply connected in series to the solid state relay.

According to the present embodiments, since a connection method of a snubber circuit is carefully devised when a capacitor short-circuits and when a switching element is disconnected, it is possible to prevent other electronic parts from being burnt, which is attributable to over-current, by making use of a single over-current protection element. For this reason, the configuration is simplified and there is no increase in cost.

DETAILED DESCRIPTION

Hereinafter, preferred embodiments will be described with reference to the accompanying drawings. Unless otherwise specified, "a" or "an" means "one or more."

First Embodiment

Figure 1:
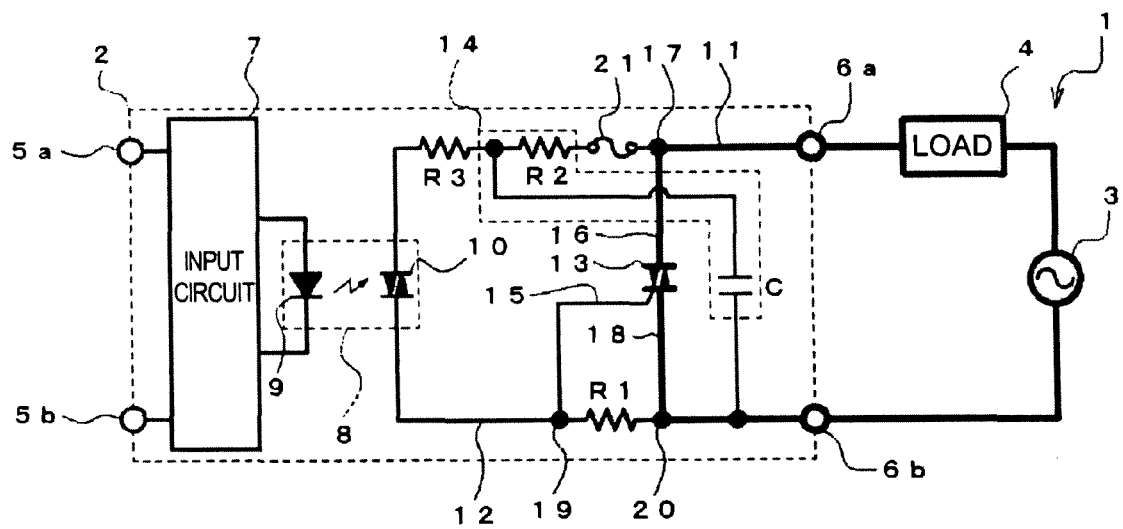
FIG. 1 is a diagram that illustrates a load drive circuit according to a first embodiment.

FIG. 1 is a configuration diagram of a load drive circuit 1 including a solid state relay 2 according to a first embodiment. The load drive circuit 1 includes a solid state relay 2, an AC power supply 3, and a load 4.

When electric power is supplied from a power supply (not illustrated) to the solid state relay 2 via a pair of input terminals 5a and 5b, the solid state relay 2 enters an ON state, enabling supply of electric power from the AC power supply 3 to the load 4, such as a motor, connected between a pair of output terminals 6a and 6b.

The input terminals 5a and 5b are connected to an input circuit 7 to which a light-emitting element of a photo coupler 8 is connected. Here, a light-emitting diode 9 is used for the light-emitting element. A phototriac coupler 10 is used for a light-receiving element of a photocoupler 8.

Both terminals of the phototriac coupler 10, and the output terminals 6a and 6b are connected to each other via a first connection line 11 and a second connection line 12, respectively. Each of a triac 13 and a snubber circuit 14 is connected between the first connection line 11 and the second connection line 12.

The triac 13 is a bidirectional thyristor to be turned on by a current having a predetermined current value being inputted to a gate terminal 15. In the triac 13, one main terminal (a first main terminal 16) is connected to the first connection line 11 at a first node 17, and the gate terminal 15 and another main terminal (a second main terminal 18) are connected to the second connection line 12 at a second node 19 and a third node 20, respectively. In this configuration, the triac 13 is connected in parallel to the phototriac coupler 10. In addition, a resistor R3, a resistor R2 of the snubber circuit 14, and a fuse 21 are connected in series in the first connection line 11 between one end of the phototriac coupler 10 and the first node 17, in this order, from the phototriac coupler side. A resistor R1 is connected in the second connection line 12 between the second node 19 and the third node 20.

The snubber circuit 14 includes the resistor R2 and a capacitor C1, and the resistor R2 is connected between the resistor R3 of the first connection line 11 and one terminal of the triac 13. The capacitor C1 is connected to the first connection line 11 between both the resistors R3 and R2, and connected to the second connection line 12 between the second main terminal 18 of the triac 13 and the output terminal 6b on the opposite side.

The fuse 21, as an example of the over-current protection element, is connected in the first connection line 11, between one end of the resistor R2 of the snubber circuit 14 and the first node to which the first main terminal 16 of the triac 13 is connected.

Next, operation of the load drive circuit 1 including the solid state relay 2 having the above configuration is described.

When current is supplied from the power supply (not illustrated) to the input terminals 5a and 5b, light is outputted from the light-emitting diode 9 serving as the light-emitting element, and this light is received and then converted into current by the phototriac coupler 10. That is, the phototriac coupler 10 enters an ON state. When the phototriac coupler 10 enters an ON state and the current exceeding a reference value is inputted to the gate terminal 15 of the triac 13, the triac 13 also enters an ON state. Thereby, as indicated by a thick line of FIG. 1, the AC power supply 3, the load 4, and the triac 13 form a closed circuit, so that the load 4 will enter a driving state.

Figure 2:
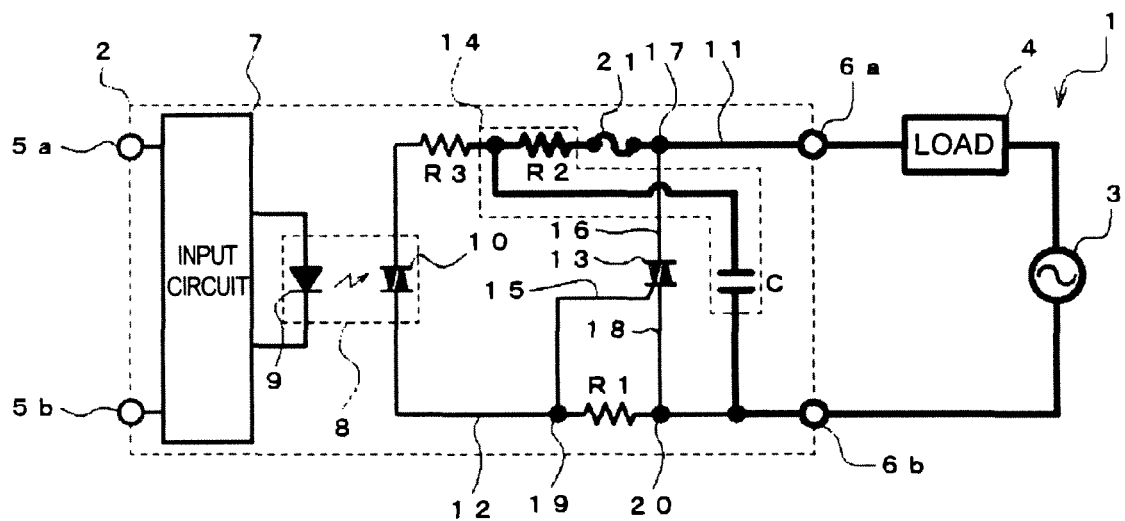
FIG. 2 is a circuit diagram that illustrates a conduction path when a capacitor of a snubber circuit short-circuits, in the load drive circuit of FIG. 1.

Incidentally, the capacitor of the snubber circuit 14 may be short-circuited when a crack occurs by a shock or the like or when the circuit is used for a long period of time. In such a case, the closed circuit that was formed by the AC power supply 3, the load 4, and the triac 13 will be formed by the AC power supply 3, the load 4, and the snubber circuit 14 as indicated by a thick line of FIG. 2. For this reason, although more current than needed flows into the resistor R2 of the snubber circuit 14, the fuse 21 is connected in the middle of the closed circuit. As a result, the fuse 21 blows out, preventing the resistor R2 from being burnt.

Figure 3:
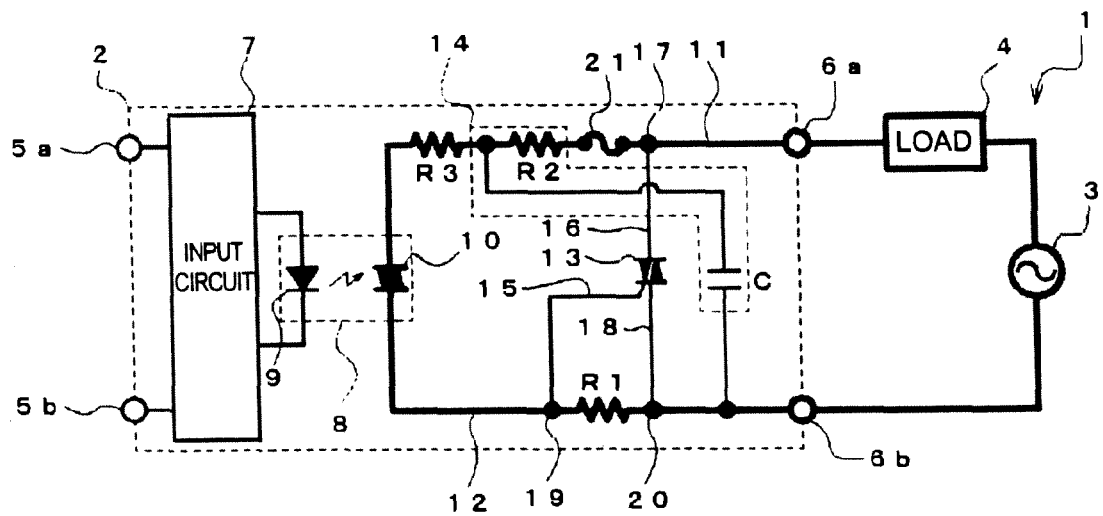
FIG. 3 is a circuit diagram that illustrates a conduction path when a triac is disconnected, in the load drive circuit of FIG. 1.

When the triac 13 is disconnected due to a shock or the like, the closed circuit which was normally formed by the AC power supply 3, the load 4, and the triac 13 will be formed by the AC power supply 3, the load 4, and the phototriac coupler 10 as indicated by a thick line in FIG. 3. For this reason, more current than needed flows into the resistor R2 or the phototriac coupler 10, but the fuse 21 serving as the over-current protection element is connected in this closed circuit, especially to one side of the load 4 connected to the photocoupler 8 rather than a side connected to the triac 13. As a result, the fuse 21 blows out, preventing the resistor R1 or R3, or the phototriac coupler 10 from being burnt. Moreover, because of the existence of the resistor R2 of the snubber circuit 14, the flow of the over-current to the phototriac coupler 10 can be suppressed. Therefore, the fuse 21 blows out first, so that the phototriac coupler 10 and the like will not be burnt. Furthermore, since the resistor R2 of the snubber circuit 14 is shared to serve a double purpose, the increase in cost can be suppressed.

Thus, according to the above-mentioned embodiment, parts other than the damaged electronic parts can reliably be prevented from being burnt because the fuse 21 blows out. For this reason, subsequent maintenance work can be easily carried out. In addition, since the measure to cope with both the case where the triac 13 is disconnected and the case where the capacitor short-circuits with use of the single fuse 21, the other parts can be appropriately prevented from being burnt, and the increase in cost can be suppressed.

Second Embodiment

Figure 4:
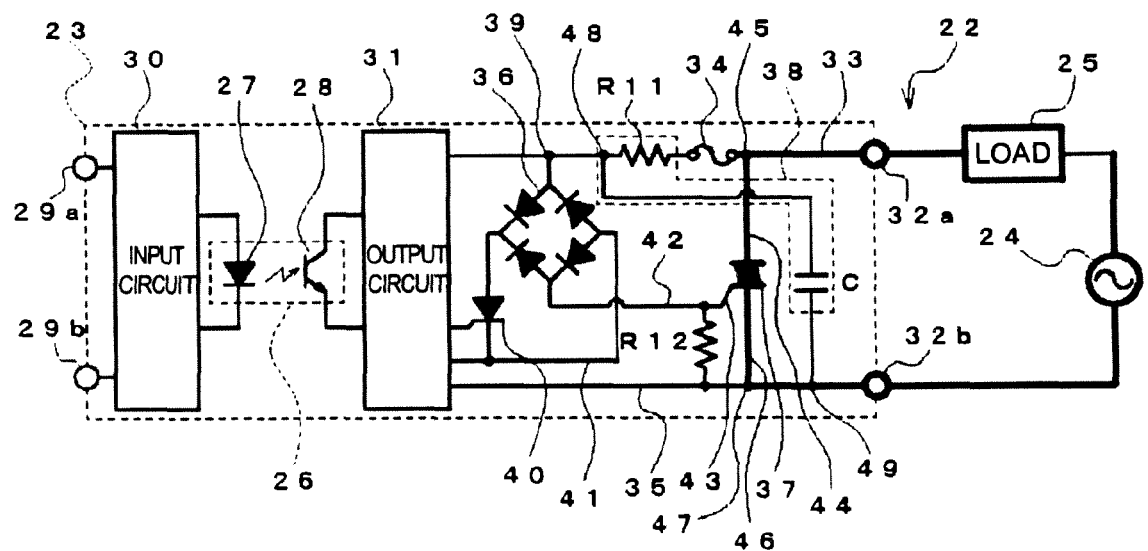
FIG. 4 is a diagram that illustrates a load drive circuit according to a second embodiment.

FIG. 4 illustrates a configuration of a load drive circuit 22 including a solid state relay 2 according to a second embodiment. The load drive circuit 22 includes a solid state relay 23, an AC power supply 24, and a load 25 that are similar to the first embodiment.

As compared with the first embodiment, the solid state relay 23 is the same in that a light-emitting diode 27 is used for a light-emitting element of a photocoupler 26, but is different in that a photo-transistor coupler 28 is used for a light-receiving element. For this reason, the solid state relay 23 is configured as described below.

That is, an input circuit 30 is connected to input terminals 29a and 29b, and the light-emitting diode 27 of the photocoupler 26 is connected to the input circuit 30. In addition, each terminal of the photo-transistor coupler 28 is connected to an output circuit 31. Each of a resistor R11 of a snubber circuit 38, and a fuse 34 is connected in the middle of a first connection line 33 that connects the output circuit 31 to one output terminal 32a. A bridge type full wave rectifying circuit 36, a triac 37, and a capacitor C2 of the snubber circuit 38 are connected between the first connection line 33, and a second connection line 35 which connects the output circuit 31 to the other output terminal 32b.

One terminal of the bridge type full wave rectifying circuit 36 is connected to the first connection line 33 at a first node 39, and a thyristor 40, which is turned on/off by a signal supplied from the output circuit 31, is connected to the other terminal. Another terminal of the bridge type full wave rectifying circuit 36 is connected to the output circuit 31 via a third connection line 41, and a further terminal, which is the remaining terminal, is connected to a gate terminal 43 of the triac 37 via a fourth connection line 42. Thus, when an ON signal from the output circuit 31 is outputted to the thyristor 40 and the thyristor 40 is turned on, the ON signal from the bridge type full wave rectifying circuit 36 is outputted to the thyristor 37.

In the triac 37, one main terminal (a first main terminal 44) is connected to the first connection line 33 at a second node 45, and another main terminal (a second main terminal 46) is connected to the second connection line 35 at a third node 47. The triac 37 will enter an ON state in response to the ON signal which is outputted from the bridge type full wave rectifying circuit 36 and inputted to the gate terminal 43, and forms a closed circuit between the AC power supply 24 and the load 25.

As described above, the resistor R11 of the snubber circuit 38 is connected between the first node 39 and the second node 45 (a position of a node of one terminal of the triac 37) on the first connection line 33. In addition, the second capacitor C2 is connected between a fourth node 48 (between the first node 39 and the resistor R11) of the first connection line 33, and a fifth node 49 (between the second main terminal 46 of the triac 37 and the other output terminal 32b) of the second connection line 35.

Next, operation of the load drive circuit 22 including the solid state relay 23 having the above-described configuration is described.

When direct current (DC) is supplied to the input terminals 29a and 29b from a DC power supply, light is outputted from the light-emitting diode 27, and the photo-transistor coupler 28 enters an ON state. Thereby, voltage is applied to the bridge type full wave rectifying circuit 36 from the output circuit 31, and an ON signal is outputted to the thyristor 40. As a result, the ON signal is inputted to the gate terminal 15 of the triac 37 from the bridge type full wave rectifying circuit 36, so that the triac 37 enters an ON state. That is, similarly to the first embodiment, a closed circuit is formed by the AC power supply 24, the load 25, and the triac 37 as indicated by a thick line of FIG. 4, and the load 25 enters a driving state.

Figure 5:
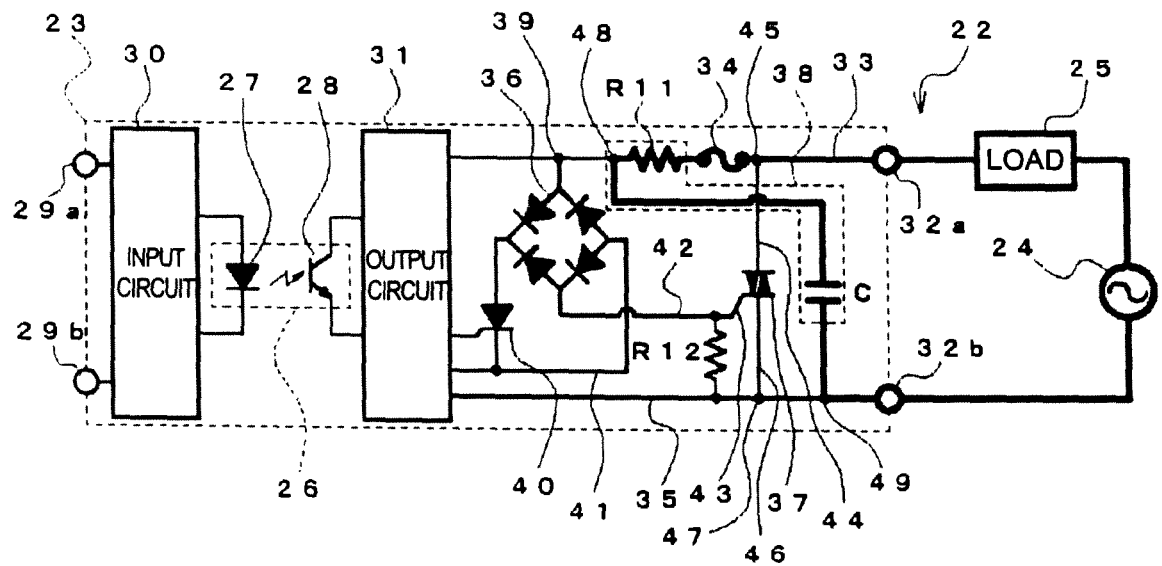
FIG. 5 is a circuit diagram that illustrates an conduction path when a capacitor of a snubber circuit short-circuits, in the load drive circuit of FIG. 4.

In addition, the capacitor C2 of the snubber circuit 38 may be short-circuited, when a crack occurs by a shock or the like or when it is used for a long period of time. In such a case, the closed circuit which was formed by the AC power supply 24, the load 25, and the triac 37 will be formed by the AC power supply 24, the load 25, and the snubber circuit 38 as indicated by a thick line of FIG. 5. For this reason, although more current than needed flows into the resistor of the snubber circuit 38, the fuse 34 is connected in the middle of the closed circuit. As a result, the fuse 34 blows out, preventing the resistor from being burnt.

Figure 6:
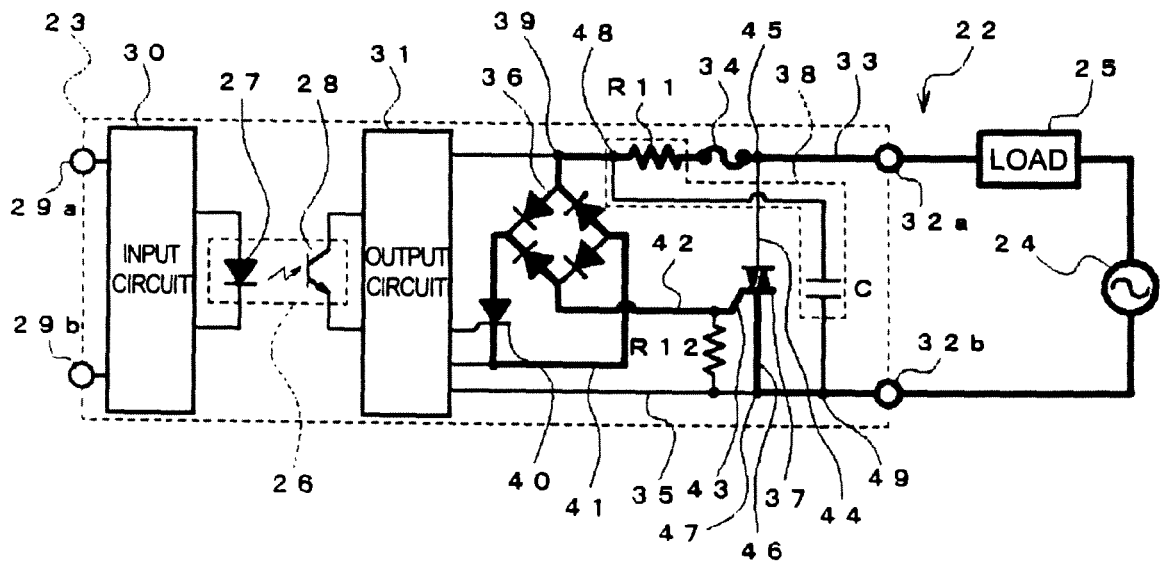
FIG. 6 is a circuit diagram that illustrates a conduction path when a triac is disconnected, in the load drive circuit of FIG. 4.

In addition, when the triac 37 is disconnected by a shock or the like, the closed circuit which was formed of the AC power supply 24, the load 25, and the triac 37 will be formed by the AC power supply 24, the load 25, the bridge type full rectifying circuit 36, and the resistor as indicated by a thick line of FIG. 6. For this reason, although more current than needed flows into the bridge type full rectifying circuit 36, the thyristor 40, and the resistor R12, the fuse 34 is connected in the middle of the closed circuit, especially connected to one side of the load 25 connected to the photo-transistor coupler 28 rather than a side connected to the triac 37. As a result, the fuse 34 blows out and any of the bridge type full wave rectifying circuit 36, the thyristor 40, or the resistor R11 is prevented from being burnt. Moreover, because of the existence of the resistor R11 of the snubber circuit 38, the flow of the over-current to the bridge type full wave rectifying circuit 36 can be suppressed. Therefore, the fuse 34 blows out first, so that the bridge type full wave rectifying circuit 36 and the like may not be burnt. Furthermore, since the resistor R11 of the snubber circuit 38 is shared to serve a double purpose, the increase in cost can be suppressed.

Thus, according to the second embodiment, since the fuse 34 blows out similarly to the first embodiment, parts other than the damaged electronic parts can be reliably prevented from being burnt. For this reason, subsequent maintenance work can be easily carried out. In addition, since the measure to cope with both the case where the triac 37 is disconnected and the case where the capacitor C2 short-circuits with use of the single fuse 34, burning of the parts can be prevented appropriately, and the increase in cost can be suppressed.

The present embodiments are not limited to the configuration described above, and can be modified in various ways.

For example, although the above-mentioned embodiments are described in connection with the case where a fuse serves as an over-current protection element, other electronic parts such as a thermistor may serves as the over-current protection element.

The solid state relay 2 according to the present embodiments can be used for a general part of the load drive circuit adapted to turn on/off electric power supplied to loads, such as a motor.

There has thus been shown and described a solid state relay and load drive circuit using the same which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A solid state relay comprising:
   a pair of input terminals;
   a light-emitting element between the pair of input terminals;
   a light-receiving element configured to carry out photo-electric conversion on light outputted from the light-emitting element and configured to output current;
   a pair of output terminals configured to connect to an AC power supply and a load, the pair of output terminals including a first output terminal and a second output terminal;
   a first connection line connecting a first end of the light-receiving element to the first output terminal;
   a second connection line connecting a second end of the light-receiving element to the second output terminal;
   a switching element between the first connection line and the second connection line and configured to be turned on by the current outputted from the light-receiving element; and a snubber circuit between the first connection line and the second connection line and including a capacitor and a resistor, the capacitor and the resistor connected in series, wherein the resistor is electrically coupled at a first end to the light-receiving element and at a second end to the switching element, an over-current protection element is coupled at a first end to the first connection line and at a second end to the second end of the resistor, and wherein the over-current protection element is configured to blow out when more current than needed flows into the snubber circuit or the light-receiving element in order to prevent the snubber circuit and the light-receiving element from being burnt.

2. The solid state relay according to claim 1, wherein
the light-receiving element is a phototriac coupler, and
the switching element and the capacitor connect to the phototriac coupler in parallel.

3. The solid state relay according to claim 1, wherein:
the light-receiving element is a photo-transistor coupler,
the photo-transistor coupler connects a bridge type full wave rectifying circuit to a thyristor that is configured to turn on/off the bridge type full wave rectifying circuit via an output circuit,
the switching element and the capacitor are connected in parallel, and
an output terminal of the bridge type full wave rectifying circuit connects to the switching element.

4. A load drive circuit comprising:
a solid state relay comprising:
  a pair of input terminals;
  a light-emitting element between the pair of input terminals;
  a light-receiving element configured to carry out photoelectric conversion on light outputted from the light-emitting element and configured to output current;
  a pair of output terminals configured to connect to an AC power supply and a load, the pair of output terminals including a first output terminal and a second output terminal;
  a first connection line connecting a first end of the light-receiving element to the first output terminal;
  a second connection line connecting a second end of the light-receiving element to the second output terminal;
  a switching element between the first connection line and the second connection line and configured to be turned on by the current outputted from the light-receiving element; and
  a snubber circuit between the first connection line and the second connection line and including a capacitor and a resistor, the capacitor and the resistor connected in series, wherein the resistor is electrically coupled at a first end to the light-receiving element and at a second end to the switching element, an over-current protection element is coupled at a first end to the first connection line and at a second end to the second end of the resistor, and, wherein the load and a power supply connect in series to the solid state relay, and the over-current protection element is configured to blow out when more current than needed flows into the snubber circuit or the light-receiving element in order to prevent the snubber circuit and the light-receiving element from being burnt.

5. The solid state relay according to claim 4, wherein
the light-receiving element is a phototriac coupler, and
the switching element and the capacitor connect to the phototriac coupler in parallel.

6. The solid state relay according to claim 4, wherein:
the light-receiving element is a photo-transistor coupler,
the photo-transistor coupler connects a bridge type full wave rectifying circuit to a thyristor that is configured to turn on/off the bridge type full wave rectifying circuit via an output circuit,
the switching element and the capacitor are connected in parallel, and
an output terminal of the bridge type full wave rectifying circuit connects to the switching element.

\* \* \* \* \*